United States Patent
Werner et al.

(10) Patent No.: US 10,608,368 B2
(45) Date of Patent: Mar. 31, 2020

(54) MODULAR PLUG-IN CONNECTOR, REPLACEABLE MODULE PRINTED CIRCUIT BOARD

(71) Applicant: Phoenix Contact GmbH & Co. KG, Blomberg (DE)

(72) Inventors: Ingo Werner, Detmold (DE); Thorsten Friedrich, Aerzen (DE); Klaus-Michael Bath, Blomberg (DE); Andreas Schrader, Delbrueck (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 16/195,916

(22) Filed: Nov. 20, 2018

(65) Prior Publication Data

US 2019/0165511 A1 May 30, 2019

(30) Foreign Application Priority Data

Nov. 27, 2017 (BE) .................................. 2017/5861

(51) Int. Cl.
*H01R 12/00* (2006.01)
*H01R 13/514* (2006.01)
(Continued)

(52) U.S. Cl.
CPC ......... *H01R 13/514* (2013.01); *H01R 9/2408* (2013.01); *H01R 12/515* (2013.01);
(Continued)

(58) Field of Classification Search
CPC .... H01R 9/2408; H01R 12/515; H01R 12/55; H01R 12/716; H01R 13/514; H01R 13/6658; H05K 1/141; H05K 2201/10189
(Continued)

(56) References Cited

U.S. PATENT DOCUMENTS 4,241,381 A * 12/1980 Cobaugh .............. H05K 7/1457
361/624
4,582,386 A * 4/1986 Martens ............... H01R 12/727
439/101
(Continued)

FOREIGN PATENT DOCUMENTS

CN 101674706 A 3/2010
CN 104321932 A 1/2015
(Continued)

*Primary Examiner* — Abdullah A Riyami
*Assistant Examiner* — Vladimir Imas
(74) *Attorney, Agent, or Firm* — Leydig, Voit & Mayer, Ltd.

(57) ABSTRACT

A modular plug-in connector includes: at least one connection terminal; and a printed circuit board module housing which is connected to the at least one connection terminal. The printed circuit board module housing includes a recess for reversibly inserting a module printed circuit board, a voltage input terminal connectable to a voltage source, and a voltage supply contact that is electrically connected to the voltage input terminal. The module printed circuit board inserted in the recess is suppliable with electrical energy from the voltage input terminal vis-à-vis the voltage supply contact. The printed circuit board module housing includes a signal line terminal and a signal line contact electrically connected to the signal line terminal, such that data exchange between the signal line terminal and the module printed circuit board inserted into the recess occurs using the signal line contact.

9 Claims, 2 Drawing Sheets

(51) Int. Cl.
*H01R 12/71* (2011.01)
*H01R 9/24* (2006.01)
*H01R 13/66* (2006.01)
*H01R 12/51* (2011.01)
*H01R 12/55* (2011.01)
*H05K 1/14* (2006.01)

(52) U.S. Cl.
CPC ........... *H01R 12/55* (2013.01); *H01R 12/716* (2013.01); *H01R 13/6658* (2013.01); *H05K 1/141* (2013.01); *H05K 2201/10189* (2013.01)

(58) Field of Classification Search
USPC ......................................................... 439/55
See application file for complete search history.

(56) References Cited

U.S. PATENT DOCUMENTS

| | | | | |
|---|---|---|---|---|
| 4,686,506 A * | 8/1987 | Farago | .................... | G06F 13/38 341/100 |
| 4,786,259 A * | 11/1988 | Paul | ................ | H01R 24/62 29/883 |
| 4,808,114 A * | 2/1989 | Mohri | ................... | G06F 13/409 439/712 |
| 5,269,708 A | 12/1993 | DeYoung et al. | | |
| 5,584,728 A * | 12/1996 | Cheng | ................. | H01R 13/514 439/637 |
| 5,713,766 A * | 2/1998 | Davies | ................ | H01R 9/2491 439/709 |
| 5,876,239 A * | 3/1999 | Morin | ................. | H01R 13/717 439/490 |
| 5,971,813 A * | 10/1999 | Kunz | .................... | H01R 24/64 439/676 |
| 6,116,788 A * | 9/2000 | Melchior | ............. | G02B 6/3821 385/59 |
| 6,146,181 A * | 11/2000 | Plaza | .................... | H01R 9/2491 439/357 |
| 6,276,943 B1 * | 8/2001 | Boutros | ............. | H01R 13/6658 439/76.1 |
| 6,413,121 B1 * | 7/2002 | Hyland | .............. | H01R 13/6658 439/607.26 |
| 6,468,092 B1 * | 10/2002 | Graff | .................... | F15B 13/0839 439/218 |
| 6,524,118 B1 * | 2/2003 | Kikuchi | ................. | H01R 24/50 439/629 |
| 6,674,645 B2 * | 1/2004 | Anzai | .................... | H01P 1/125 174/50 |
| 6,769,939 B2 * | 8/2004 | Neumann | .............. | H01R 27/02 439/638 |
| 6,783,398 B2 * | 8/2004 | Slack | ................ | H01R 13/6658 439/620.21 |
| 6,997,742 B1 * | 2/2006 | Tung | .................... | H01R 13/514 439/101 |
| 7,458,826 B1 * | 12/2008 | Maatta | ................. | H01R 4/4809 439/79 |
| 7,845,969 B2 * | 12/2010 | Stadler | ................. | H01R 9/2458 439/441 |
| 7,942,680 B2 * | 5/2011 | MacDougall | .......... | H01R 31/08 439/108 |
| 7,950,936 B2 * | 5/2011 | Wang | .................... | H01R 13/447 439/144 |
| 8,102,657 B2 * | 1/2012 | Hiew | ..................... | G06F 1/1632 361/737 |
| 8,113,864 B2 * | 2/2012 | Chiang | .............. | H01R 13/4361 439/347 |
| 8,174,847 B2 * | 5/2012 | Ohtsuji | .................. | H05K 9/005 361/679.01 |
| 8,216,003 B2 * | 7/2012 | Fujimoto | ................. | H01R 4/38 439/709 |
| 8,282,424 B2 * | 10/2012 | Weinmann | ......... | H01R 13/6658 439/676 |
| 8,435,047 B2 * | 5/2013 | Patel | .................... | H01R 13/514 439/532 |
| 8,469,718 B2 * | 6/2013 | Kobayashi | ......... | G01N 27/4062 439/55 |
| 9,325,110 B2 * | 4/2016 | Lostoski | ............... | H01R 9/2408 |
| 9,362,639 B2 * | 6/2016 | Zhang | .................... | H01R 12/72 |
| 9,419,391 B2 * | 8/2016 | Bolouri-Saransar | ..... | H01R 4/24 |
| 9,466,897 B1 * | 10/2016 | Wu | ....................... | H01R 9/2491 |
| 9,768,572 B1 * | 9/2017 | Gelineau | ............. | H01R 33/945 |
| 9,819,124 B2 * | 11/2017 | Oberski | ............... | H01R 12/515 |
| 9,997,851 B1 * | 6/2018 | Ekrot | ................... | H01R 12/716 |
| 10,085,355 B2 | 9/2018 | Giefers | | |
| 10,170,868 B1 * | 1/2019 | Oyake | ............... | H01R 12/721 |
| 2002/0056625 A1 * | 5/2002 | Becker | .................. | B60Q 1/441 200/86.5 |
| 2007/0246256 A1 | 10/2007 | Eusterholz et al. | | |
| 2009/0035983 A1 | 2/2009 | Correll | | |
| 2010/0062617 A1 | 3/2010 | Bang et al. | | |
| 2013/0316552 A1 * | 11/2013 | Sasano | ................ | H01R 9/2608 439/122 |
| 2014/0113503 A1 | 4/2014 | Barber et al. | | |
| 2018/0090886 A1 * | 3/2018 | Jeon | ................... | H01R 13/6581 |
| 2019/0115699 A1 * | 4/2019 | Dupuis | ................ | H01R 13/719 |

FOREIGN PATENT DOCUMENTS

| | | |
|---|---|---|
| CN | 107018636 A | 8/2017 |
| DE | 4412270 A1 | 10/1995 |
| TW | 201242180 A | 10/2012 |

* cited by examiner

MODULAR PLUG-IN CONNECTOR, REPLACEABLE MODULE PRINTED CIRCUIT BOARD

CROSS-REFERENCE TO PRIOR APPLICATION

Priority is claimed to Belgian Patent Application No. BE 2017/5861, filed on Nov. 27, 2017, the entire disclosure of which is hereby incorporated by reference herein.

FIELD

The present invention relates to a plug-in connector comprising a replaceable module printed circuit board.

BACKGROUND

Electrical plug-in connectors are used to connect electrical conductors to a printed circuit board, for example. Depending on the embodiment, the electrical plug-in connector may be designed as a socket part or as a plug part. In the simplest embodiments of plug-in connectors, these are used merely for transmitting electrical power or for transmitting data and signals.

Electrical plug-in connectors that are fitted with processing electronics implemented in particular on a printed circuit board of the plug-in connector are also known. By means of the processing electronics, signals and data can be processed and forwarded. These data or signals may include, for example, an electrical voltage applied to a connection terminal of the plug-in connector, an electric current flowing through the connection terminal, or a temperature of the connection terminal.

If the requirements with regard to the processing electronics of the plug-in connector change, the plug-in connectors known from the prior art have to be replaced in their entirety, resulting in an increased cost of materials and a considerable amount of work for rewiring.

SUMMARY

In an embodiment, the present invention provides a modular plug-in connector, comprising: at least one connection terminal; and a printed circuit board module housing which is connected to the at least one connection terminal, the printed circuit board module housing comprising a recess configured for reversibly inserting a module printed circuit board, a voltage input terminal connectable to a voltage source, and a voltage supply contact that is electrically connected to the voltage input terminal, wherein the module printed circuit board inserted in the recess is suppliable with electrical energy from the voltage input terminal vis-à-vis the voltage supply contact, and wherein the printed circuit board module housing comprises a signal line terminal and a signal line contact electrically connected to the signal line terminal, such that data exchange between the signal line terminal and the module printed circuit board inserted into the recess occurs using the signal line contact.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
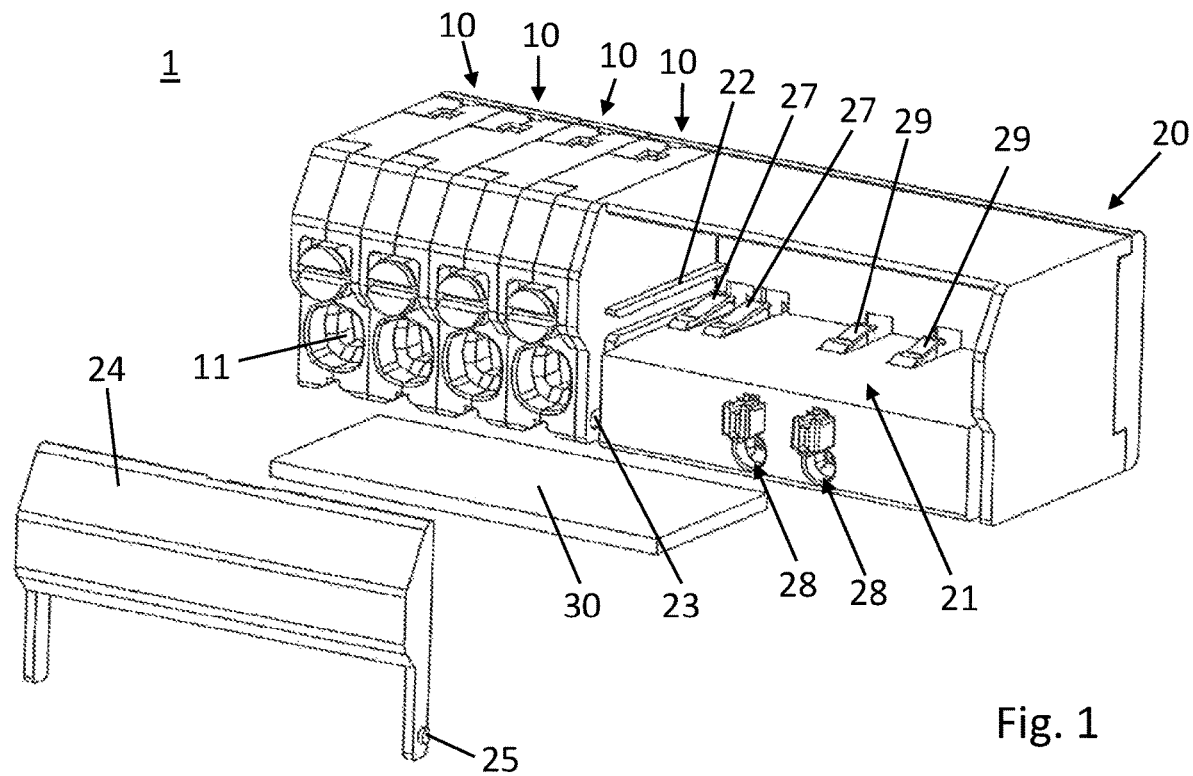
FIG. 1 is a perspective view of a modular plug-in connector according to the invention having an unmounted cover and a removed module printed circuit board.

An aspect of the present invention provides a plug-in connector the functionality of which can be adapted to different needs.

In an embodiment, the present invention provides a modular plug-in connector which comprises at least one connection terminal and a printed circuit board module housing which is connected to the connection terminal. The modular plug-in connector is designed as a modular electrical plug-in connector. The printed circuit board module housing comprises a recess for reversibly inserting a module printed circuit board. The printed circuit board module housing further comprises a voltage input terminal for connection to a voltage source and comprises a voltage supply contact that is electrically connected to the voltage input terminal. A module printed circuit board inserted in the recess can be supplied with electrical energy by the voltage input terminal by means of the voltage supply contact. Moreover, the printed circuit board module housing comprises a signal line terminal and a signal line contact electrically connected to the signal line terminal, such that data exchange between the signal line terminal and the module printed circuit board inserted into the recess is made possible by means of the signal line contact.

The modular plug-in connector according to the invention is advantageous in that the functionality of the plug-in connector can easily be changed by replacing the module printed circuit board. Therefore, when changing the signal processing logic, the plug-in connector does not have to be replaced in its entirety, meaning that it is not necessary to electrically re-connect the plug-in connector to a printed circuit board, for example. Consequently, considerably less work is required.

Due to the reversible receipt of the module printed circuit board, the module printed circuit board can be easily replaced by or exchanged with another module printed circuit board.

The printed circuit board module housing is preferably made of an insulating material. The printed circuit board module housing preferably comprises an electrically insulating plastics material or an electrically insulating ceramic material.

The recess in the printed circuit board module housing is preferably designed as a receiving space in the printed circuit board module housing. More preferably, a guiding and/or positioning device is arranged in the recess, by means of which device a module printed circuit board is guided and/or positioned in the recess.

The voltage input terminal of the printed circuit board module housing may also be referred to as a power input terminal. The voltage contact device may also be referred to as a power contact device.

The module printed circuit board is preferably formed so as to comprise electrically conductive contact pads which are positioned in such a way that, when the module printed circuit board is inserted as intended, the contact pads are in electrical contact with the voltage contact device and with the signal line contact.

The modular plug-in connector is preferably designed in such a way that the at least one connection terminal is electrically connected to the signal line contact such that data exchange between the connection terminal and the module printed circuit board is made possible.

Data exchange from the connection terminal to the module printed circuit board and/or from the module printed circuit board to the connection terminal is made possible.

The modular plug-in connector is preferably designed in such a way that the printed circuit board module housing comprises a receiving guide arranged in the recess such that the module printed circuit board can be inserted between, on one side, the receiving guide and, on the other side, the voltage supply contact and the signal line contact.

By means of such an embodiment of the modular plug-in connector, it can be ensured that the module printed circuit board is positioned as intended and that the voltage supply contact and the signal line contact are reliably electrically contacted by the module printed circuit board.

The receiving guide is preferably designed as a guide bar, more preferably as two guide bars. The guide bars are preferably formed on lateral walls of the printed circuit board module housing and protrude into a receiving space of the recess.

The modular plug-in connector is preferably designed in such a way that the voltage supply contact is subjected to spring force such that a module printed circuit board positioned between the receiving guide and the voltage supply contact is subjected to force by means of the voltage supply contact in the direction of the receiving guide.

By means of such an embodiment of the modular plug-in connector, it is ensured that the voltage supply contact can be reliably electrically contacted by the module printed circuit board.

The modular plug-in connector is preferably designed in such a way that the signal line contact is subjected to spring force such that a module printed circuit board positioned between the receiving guide and the signal line contact is subjected to force by means of the signal line contact in the direction of the receiving guide.

By means of such an embodiment of the modular plug-in connector, it is ensured that the signal line contact can be reliably electrically contacted by the module printed circuit board.

The modular plug-in connector is preferably designed in such a way that the printed circuit board module housing comprises a cover which can be moved between an open position in which the recess is accessible and a closed position in which the recess is closed by means of the cover.

By means of such an embodiment of the modular plug-in connector, the recess, and thus the module printed circuit board positioned in the recess, is protected from undesirable contact and from contamination.

The modular plug-in connector is preferably designed in such a way that the cover comprises metal such that the recess is protected from electromagnetic radiation by means of the cover when said cover is in its closed position.

By means of such an embodiment of the modular plug-in connector, the recess, and thus the module printed circuit board positioned in the recess, is better protected from electromagnetic radiation.

Preferably, the cover consists of a metal. More preferably, a metal layer is embedded in the cover such that the outer layers of the cover consist of an insulating material (e.g. plastics material or ceramic material) and a metal layer is arranged between the outer layers.

The modular plug-in connector is preferably designed in such a way that the printed circuit board module housing comprises metal such that the recess is protected from electromagnetic radiation by means of the printed circuit board module housing.

By means of such an embodiment of the modular plug-in connector, the recess, and thus the module printed circuit board positioned in the recess, is better protected from electromagnetic radiation.

Preferably, the printed circuit board module housing consists of a metal. More preferably, a metal layer is embedded in the printed circuit board module housing such that the outer layers of the printed circuit board module housing consist of an insulating material (e.g. plastics material or ceramic material) and a metal layer is arranged between the outer layers.

The modular plug-in connector is preferably designed in such a way that the modular plug-in connector is designed as a printed circuit board terminal and the voltage input terminal is arranged on a bottom face of the printed circuit board module housing.

In the following description, identical reference numerals designate identical components or identical features, and therefore a description made with respect to one figure in relation to a component also applies to the other figures, so as to avoid a repeated description. Furthermore, individual features described in connection with one embodiment may also be used separately in other embodiments.

FIG. 1 is a perspective view of a modular plug-in connector 1 according to the invention having an unmounted cover 24 and a removed module printed circuit board 30. The modular plug-in connector 1 comprises at least one connection terminal 10 and a printed circuit board module housing 20. In the embodiment shown in FIG. 1, the modular plug-in connector 1 comprises four mutually adjacent and interconnected connection terminals 10. Each of the connection terminals 10 has an input terminal 11 and an output terminal 12 shown in FIG. 3. The input terminals 11 are respectively arranged on a front face of the modular plug-in connector 1, and the output terminals 12 are respectively arranged on a rear face of the modular plug-in connector 1.

It can be seen from FIG. 1 that the printed circuit board module housing 20, which is connected to the adjacent connection terminal 10 to the left in FIG. 1, has a recess 21. The recess 21 is designed as a receiving space 21. The recess 21 is used for reversibly inserting a module printed circuit board 30. This means that one module printed circuit board 30 can be replaced by another module printed circuit board 30.

Figure 3:
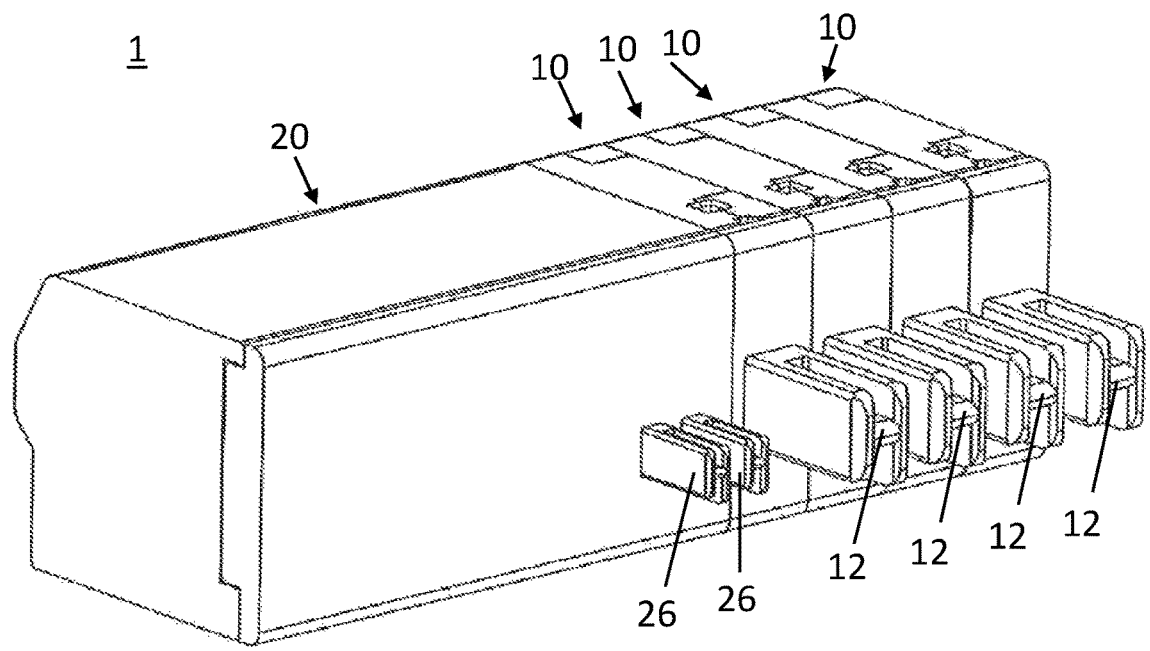
FIG. 3 is a perspective view of a rear face of the modular plug-in connector shown in FIG. 2.

In the recess 21, a voltage supply contact 27 is arranged which is electrically connected to a voltage input terminal 26 of the printed circuit board module housing 20 shown in FIG. 3. The voltage input terminal 26 is arranged on the rear face of the printed circuit board module housing 20. A module printed circuit board 30 inserted in the recess 21 can therefore be supplied with electrical energy by the voltage input terminal 26 by means of the voltage supply contact 27.

Furthermore, two signal line contacts 29 are arranged in the recess 21 which are electrically connected to two signal line terminals 28 of the printed circuit board module housing 20. The signal line terminals 28 are arranged on the front face of the printed circuit board module housing 20. Therefore, a module printed circuit board 30 inserted in the recess 21 can exchange data and/or signals with other electrical and/or electronic equipment by means of the signal line contacts 29 and the signal line terminals 28.

The signal line contacts 29 are furthermore preferably electrically connected to one or to a plurality of the connection terminals 10 such that data exchange between the connection terminal 10 or connection terminals 10 and the module printed circuit board 30 is made possible. For example, an electric current flowing through a connection terminal 10 can be determined by means of the module printed circuit board 30. Furthermore, when an appropriate sensor system is provided in the connection terminals 10, the temperature in the connection terminals 10, for example, can be determined and forwarded by means of the module printed circuit board 30 to a further piece of electronic equipment.

It can be seen from FIG. 1 that a receiving guide 22 is arranged in the recess 21 in the printed circuit board module housing 20. The receiving guide 22 in this case is designed in the form of guide bars 22. One guide bar is arranged on an inner face of a lateral wall of the printed circuit board module housing 20 and a further guide bar of the receiving guide 22 is arranged on an inner face of an opposite lateral wall of the printed circuit board module housing.

The module printed circuit board 30 can be inserted or pushed in between, on one side, the receiving guide 22 and, on the other side, the voltage supply contact 27 and the signal line contacts 29. The voltage supply contact 27 and the signal line contacts 29 are subjected to spring force such that a module printed circuit board 30 positioned between the receiving guide 22 and the voltage supply contact 27 and the signal line contacts 29 is subjected to force by means of the voltage supply contact 27 and the signal line contact 29 in the direction of the receiving guide 22. Reliable electrical contacting of the module printed circuit board 30 by means of the voltage supply contact 27 and the signal line contact 29 is thus ensured.

Although not apparent from FIG. 1, electrical contact devices in the form of contact pads are arranged at corresponding points on the module printed circuit board 30 and are in electrical contact with the voltage supply contact 27 and the signal line contacts 29 when the module printed circuit board 30 is inserted as intended in the recess 21.

Figure 2:
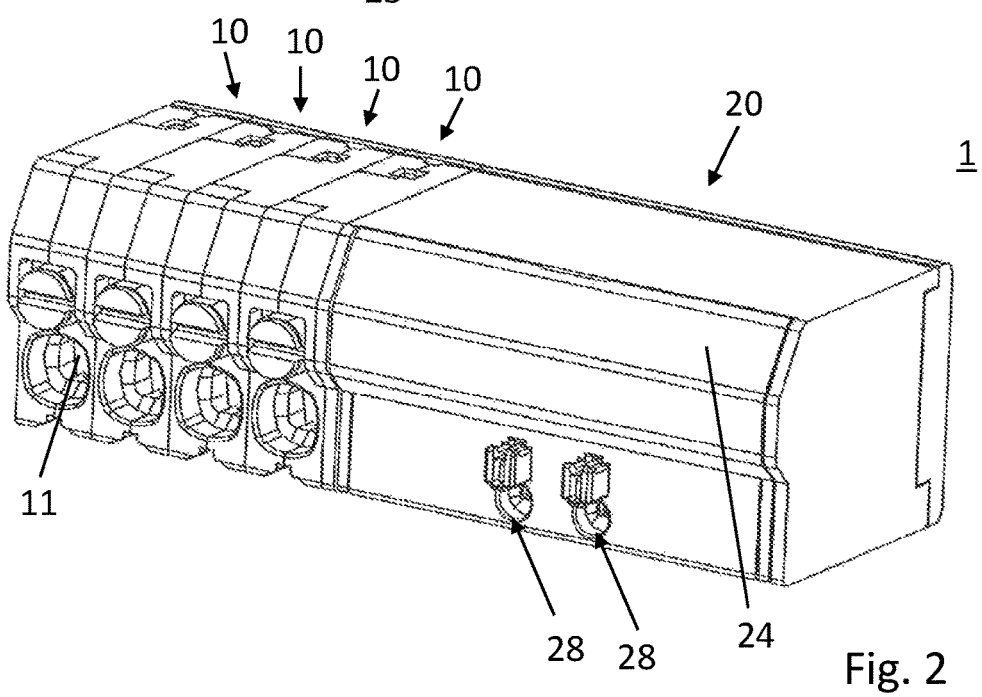
FIG. 2 is a perspective view of the modular plug-in connector shown in FIG. 1 having a mounted cover.

The modular plug-in connector 1 according to the invention further comprises a cover 24 which can be moved between an open position in which the recess 21 is accessible and a closed position (shown in FIG. 2) in which the recess 21 is closed by means of the cover 24. For this purpose, the cover 24 comprises two bearing journals 25, which are inserted into corresponding bearing openings 23 in the printed circuit board module housing 20 such that the cover 24 is pivotally mounted.

The cover 24 is preferably made of an electrically insulating material, such as a plastics material or an electrically insulating ceramic material. A metal layer is preferably provided in the cover 24 such that the recess 21 is protected from electromagnetic radiation by means of the cover 24.

For this purpose, the printed circuit board module housing 20 may also comprise a metal layer such that the recess 21 is also protected from electromagnetic radiation by means of the printed circuit board module housing 20.

Figure 4:
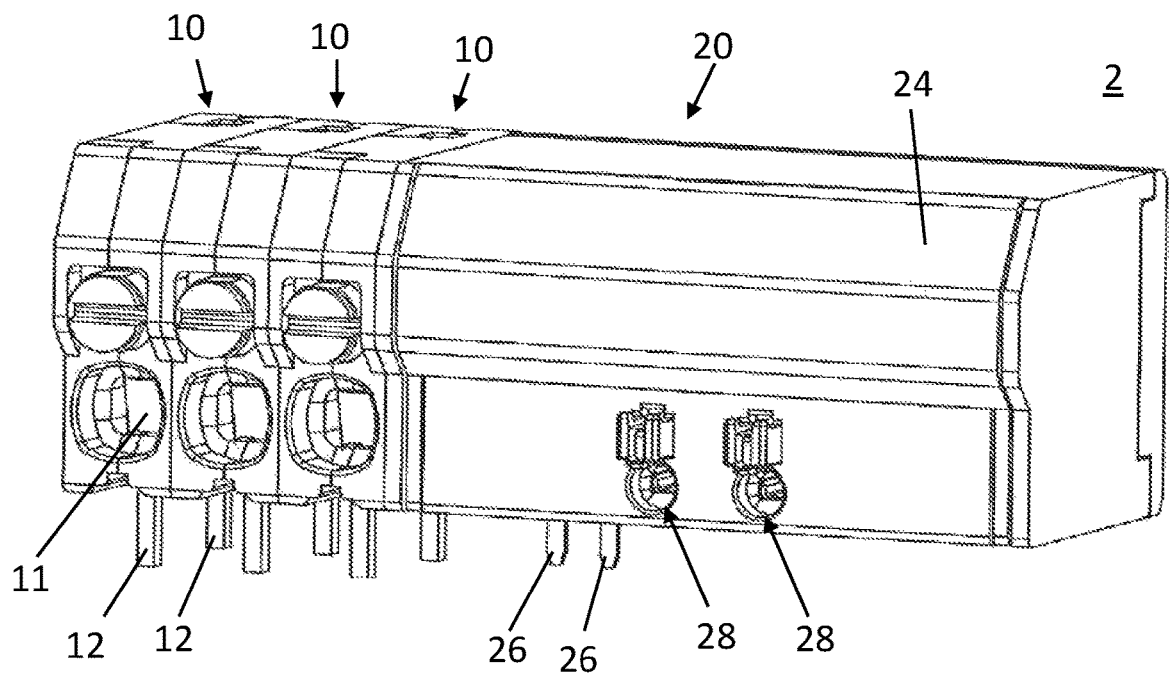
FIG. 4 is a perspective view of a modular plug-in connector designed as a printed circuit board terminal.

FIG. 4 shows a modular plug-in connector 2 which is designed as a printed circuit board terminal 2. The printed circuit board terminal 2 differs from the modular plug-in connector 1 shown in FIG. 1 in that the output terminals 12 of the connection terminals 10 and also the voltage input terminals 26 of the printed circuit board module housing 20 are arranged on a bottom face of the printed circuit board terminal 2 such that they can be inserted into corresponding openings in a printed circuit board and can be electrically contacted therewith, for example by means of soldering. The design of the printed circuit board terminal 2 shown in FIG. 4 is otherwise identical to the design of the modular plug-in connector 1 shown in FIGS. 1 to 3.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 1 modular plug-in connector
2 printed circuit board terminal
10 connection terminal
11 input terminal (of the connection terminal)
12 output terminal (of the connection terminal)
20 printed circuit board module housing
21 recess (in the printed circuit board module housing)
22 receiving guide
23 bearing opening (in the printed circuit board module housing)
24 cover (of the printed circuit board module housing)
25 bearing journal (of the cover)
26 voltage input terminal/power input terminal (of the printed circuit board module housing)
27 voltage supply contact/power supply contact
28 signal line terminal (of the printed circuit board module housing)
29 signal line contact
30 module printed circuit board

What is claimed is:
1. A modular plug-in connector, comprising:
at least one connection terminal; and
a printed circuit board module housing which is connected to the at least one connection terminal, the printed circuit board module housing comprising a recess configured for reversibly inserting a module printed circuit board, a voltage input terminal connect- able to a voltage source, and a voltage supply contact that is electrically connected to the voltage input terminal, wherein the module printed circuit board inserted in the recess is suppliable with electrical energy from the voltage input terminal by the voltage supply contact, and wherein the printed circuit board module housing comprises a signal line terminal and a signal line contact electrically connected to the signal line terminal, such that data exchange between the signal line terminal and the module printed circuit board inserted into the recess occurs using the signal line contact.

2. The modular plug-in connector part according to claim 1, wherein the at least one connection terminal is electrically connected to the signal line contact so as to enable data ex-change between the connection terminal and the module printed circuit board.

3. The modular plug-in connector according to claim 1, wherein the printed circuit board module housing further comprises a receiving guide arranged in the recess such that the module printed circuit board is insertable between, on one side, the receiving guide, and, on an other side, the voltage supply contact and the signal line contact.

4. The modular plug-in connector according to claim 1, wherein the printed circuit board module housing further comprises a cover movable between an open position in which the recess is accessible and a closed position in which the recess is closed by the cover.

5. The modular plug-in connector according to claim 4, wherein the cover comprises metal such that the recess is protected from electromagnetic radiation by the cover when the cover is in its closed position.

6. The modular plug-in connector according to claim 1, wherein the printed circuit board module housing further comprises metal such that the recess is protected from electromagnetic radiation by the printed circuit board module housing.

7. The modular plug-in connector according to claim 1, wherein the modular plug-in connector comprises a printed circuit board terminal and the voltage input terminal is arranged on a bottom face of the printed circuit board module housing.

8. A modular plug-in connector, comprising:
at least one connection terminal; and
a printed circuit board module housing which is connected to the at least one connection terminal, the printed circuit board module housing comprising a recess configured for reversibly inserting a module printed circuit board, a voltage input terminal connectable to a voltage source, and a voltage supply contact that is electrically connected to the voltage input terminal, wherein the module printed circuit board inserted in the recess is suppliable with electrical energy from the voltage input terminal by the voltage supply contact, wherein the printed circuit board module housing comprises a signal line terminal and a signal line contact electrically connected to the signal line terminal, such that data exchange between the signal line terminal and the module printed circuit board inserted into the recess occurs using the signal line contact, wherein the printed circuit board module housing further comprises a receiving guide arranged in the recess such that the module printed circuit board is insertable between, on one side, the receiving guide, and, on an other side, the voltage supply contact and the signal line contact, and wherein the voltage supply contact is subjected to spring force such that the module printed circuit board positioned between the receiving guide and the voltage supply contact is subjected to force by the voltage supply contact in the direction of the receiving guide.

9. A modular plug-in connector, comprising:
at least one connection terminal; and
a printed circuit board module housing which is connected to the at least one connection terminal, the printed circuit board module housing comprising a recess configured for reversibly inserting a module printed circuit board, a voltage input terminal connectable to a voltage source, and a voltage supply contact that is electrically connected to the voltage input terminal, wherein the module printed circuit board inserted in the recess is suppliable with electrical energy from the voltage input terminal by the voltage supply contact, wherein the printed circuit board module housing comprises a signal line terminal and a signal line contact electrically connected to the signal line terminal, such that data exchange between the signal line terminal and the module printed circuit board inserted into the recess occurs using the signal line contact, wherein the printed circuit board module housing further comprises a receiving guide arranged in the recess such that the module printed circuit board is insertable between, on one side, the receiving guide, and, on an other side, the voltage supply contact and the signal line contact, and wherein the signal line contact is subjected to spring force such that the module printed circuit board positioned between the receiving guide and the signal line contact is subjected to force by the signal line contact in the direction of the receiving guide.

* * * * *